United States Patent [19]

Nakamura et al.

[11] 4,266,005

[45] May 5, 1981

[54] PHOTOSENSITIVE ELASTOMERIC COMPOSITION

[75] Inventors: Shohei Nakamura; Yoshiyuki Suenaga, both of Fuji, Japan

[73] Assignee: Asahi Kasei Kogyo Kabushiki Kaisha, Osaka, Japan

[21] Appl. No.: 80,364

[22] Filed: Sep. 28, 1979

[30] Foreign Application Priority Data

Oct. 2, 1978 [JP] Japan ................................ 53-121371

[51] Int. Cl.$^3$ ............................................. G03C 1/68
[52] U.S. Cl. ............................... 430/271; 204/159.18; 204/159.23; 204/281; 204/286; 430/913; 430/919
[58] Field of Search ............... 430/271, 281, 286, 907, 430/913, 919; 204/159.15, 159.18, 159.23

[56] References Cited

U.S. PATENT DOCUMENTS

| 3,551,160 | 12/1970 | Bakos et al. | 430/907 |
| 3,622,321 | 11/1971 | Saaets et al. | 96/115 R |
| 3,627,529 | 12/1971 | Frank et al. | 430/253 |
| 4,023,973 | 5/1977 | Imaizumi et al. | 430/286 |
| 4,045,231 | 8/1977 | Toda et al. | 430/286 |
| 4,162,919 | 7/1979 | Richter | 430/907 |

FOREIGN PATENT DOCUMENTS 48-12859 of 1973 Japan .

*Primary Examiner*—Jack P. Brammer
*Attorney, Agent, or Firm*—Sprung, Felfe, Horn, Lynch & Kramer

[57] ABSTRACT

A novel photosensitive elastomeric composition comprising a thermoplastic elastomer, an ethylenically unsaturated compound, a photopolymerization initiator and an N-substituted maleimide compound. The composition of the present invention is excellent in photosensitivity. The composition of the present invention is useful especially for the manufacture of flexographic printing elements.

13 Claims, No Drawings

PHOTOSENSITIVE ELASTOMERIC COMPOSITION

This invention relates to a novel photosensitive elastomeric composition. More particularly, the invention relates to a photosensitive elastomeric composition which is useful especially for the manufacture of flexographic printing elements.

Flexographic printing reliefs have heretofore been prepared according to the process comprising etching a metal plate to form a master, making a matrix of a plastic material using the master and then casting a rubbery material into the matrix and heating the rubbery material under pressure to effect curing and to form a rubber plate. Since the etching of the metal plate provides a deeply etched portion and a less deeply etched portion, when a flexographic printing relief is directly formed using the etched metal plate, the thickness of the relief obtained is not uniform in its ink-receiving portions. Therefore, it is indispensable to perform an intermediate step of forming a plastic matrix using the master. Accordingly, this process is defective in that the process requires a great expense and a long time. Moreover, since a pattern or design is transferred twice, no high precision can be attained in the resulting rubber plate. Furthermore, the back face of the rubber plate must be shaved to render the thickness uniform in the ink-receiving portion of the rubber plate when the rubber plate is actually used.

With a view to overcoming these defects, there has recently been proposed a process in which a flexographic printing plate or relief is directly prepared using a photosensitive elastomeric composition. According to this process, the back face of the plate or relief need not be shaved, and the plate or relief obtained enables printing of fine patterns or designs as different from the conventional rubber plate. However, the photosensitive elastomeric compositions which have heretofore been proposed have such a drawback that they do not necessarily have sufficient photosensitivity and, hence, require a long time of exposure to light for forming therefrom a plate or relief having small dots and fine lines.

With a view to overcoming the drawback accompanying the conventional photosensitive elastomeric compositions used for the production of flexographic printing plates, we have made extensive and intensive investigations and, as a result, have found that a photosensitive elastomeric composition comprising at least a thermoplastic elastomer, an ethylenically unsaturated compound and a photopolymerization initiator can be greatly improved in photosensitivity by incorporating thereinto an N-substituted maleimide compound whereby our purpose can be attained. We have now completed the present invention based on this finding.

More specifically, in accordance with the present invention, there is provided a photosensitive elastomeric composition comprising as a component (a) at least one thermoplastic elastomer selected from homopolymers of a conjugated diene monomer and copolymers of a conjugated diene monomer and a monoene monomer, as a component (b) at least one ethylenically unsaturated compound, as a component (c) at least one photopolymerization initiator, and as a component (d) at least one N-substituted maleimide compound selected from those maleimides wherein an N- or N,N'-substituent is a straight chain or branched alkyl group having 1 to 22 carbon atoms, a cycloalkyl group having a $C_5$–$C_8$ ring unsubstituted or substituted with 1 or 2 substituents selected from straight chain or branched alkyl groups having 1 to 6 carbon atoms, a phenyl or naphthyl group unsubstituted or substituted with 1 or 2 substituents selected from straight chain or branched alkyl groups having 1 to 6 carbon atoms and halogen atoms, an aralkyl group having a straight chain or branched $C_1$–$C_6$ alkyl moiety and a phenyl moiety unsubstituted or substituted with 1 or 2 substituents selected from straight chain or branched alkyl groups having 1 to 6 carbon atoms and halogen atoms, a straight chain or branched alkylene group having 1 to 12 carbon atoms, a phenylene group, a biphenylene group, a 1,6-hexamethylenebiphenylene group, a methylenebiphenylene group or a 2,2-diphenylenepropane group.

Representative examples of the thermoplastic elastomers to be used as the component (a) of the photosensitive elastomeric composition of the present invention include homopolymers of a conjugated diene monomer such as a crystalline 1,2-polybutadiene having a crystallinity of 10 to 30%; and copolymers of a conjugated diene monomer and a monoene monomer such as an acrylonitrile-butadiene copolymer containing 30 to 50% by weight of acrylonitrile monomer units and thermoplastic elastomeric block copolymers represented by the following general formulae:

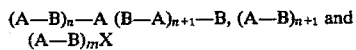

wherein A stands for a thermoplastic non-elastomeric polymer block of a monoene monomer having a glass transition temperature of 25° C. or more, B stands for an elastomeric polymer block of a conjugated diene monomer having a glass transition temperature of 10° C. or less, X stands for Sn or Si, n is an integer of from 1 to 10, and m is 2 or 4.

The thermoplastic elastomer to be used as the component (a) of the photosensitive elastomeric composition of the present invention is desired to have a number average molecular weight of 29,000 to 4,500,000. If the number average molecular weight of the thermoplastic elastomer is less than 29,000, cold flow is liable to occur, and, if the number average molecular weight is more than 4,500,000, the thermoplasticity of the thermoplastic elastomer is liable to be poor, leading to poor moldability of a composition comprising the thermoplastic elastomer and poor flexibility of the resulting molding (plate or sheet). With respect to a crystalline 1,2-polybutadiene having a crystallinity of 10 to 30% and an acrylonitrile-butadiene copolymer containing 30 to 50% by weight of acrylonitrile monomer units, the number average molecular weight thereof is more preferably in the range of from 80,000 to 500,000. When the number average molecular weight of the crystalline 1,2-polybutadiene or the acrylonitrile-butadiene copolymer is less than 80,000, the rubber elasticity is liable to be poor, and, when the number average molecular weight is more than 500,000, the solubility in a solvent is liable to be so low that the washing-out, after imagewise exposure to light, of a composition comprising the crystalline 1,2-polybutadiene or the acrylonitrile-butadiene copolymer may be incomplete. For the measurement of a number average molecular weight, there is adopted a gel permeation chromatography (GPC) method using, as a standard sample, a polystyrene manufactured by Pressure Chemical Co., U.S.A. and as an apparatus, WATERS 200 manufactured by Japan-Waters Co., Japan.

The crystalline 1,2-polybutadiene that may be used in the present invention can be obtained by polymerizing 1,3-butadiene using as the catalyst, for example, a cobalt compound such as acetylacetonatocobalt and an organic aluminum compound such as triethylaluminum according to the method as described in Japanese Patent Publication No. 32425/1969. The crystalline 1,2-polybutadiene may preferably have such a microstructure that the rate of 1,2-addition is 70% or more, preferably 85% or more, as measured according to infrared spectrophotometric analysis. If the rate of 1,2-addition is less than 70%, the crystallizability of the polybutadiene may be almost lost and the polybutadiene may be unable to be a thermoplastic elastomer. The crystalline 1,2-polybutadiene is required to have a crystallinity of 10 to 30% as measured according to X-ray analysis. If the crystallinity is less than 10%, cold flow tends to occur. If the crystallinity is more than 30%, the moldability is poor, the rubber elasticity is lost so that the 1,2-polybutadiene assumes the state of a kind of plastic, and the solubility in a solvent is so low that the washing-out of the unexposed portions of the composition comprising the 1,2-polybutadiene after imagewise exposure to light is difficult to carry out and requires a long time and the resulting printing plate has an unsatisfactory quality.

The acrylonitrile-butadiene copolymer containing 30 to 50% by weight of acrylonitrile monomer units that may be used in the present invention can be prepared according to the known methods such as disclosed in Industrial Engineering and Chemistry, vol. 47, p. 1714 (1955). For example, it is prepared by emulsion polymerization using potassium persulfate as the polymerization catalyst. If the content of the acrylonitrile monomer units is less than 30% by weight, cold flow tends to occur. If the content of the acrylonitrile monomer units is more than 50% by weight, the rubber elasticity is lost.

In the thermoplastic elastomeric block copolymers represented by the following general formulae:

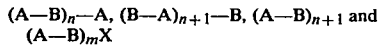

wherein A stands for a thermoplastic non-elastomeric polymer block of a monoene monomer having a glass transition temperature of 25° C. or more, B stands for an elastomeric polymer block of a conjugated diene monomer having a glass transition temperature of 10° C. or less, X stands for Sn or Si, n is an integer of from 1 to 10, and m is 2 or 4,
that may be used in the present invention, preferably, the block A are those formed by polymerizing alkenyl aromatic hydrocarbons, preferably vinyl substituted aromatic hydrocarbons and still more preferably vinyl monocyclic aromatic hydrocarbons, while the block B are polymers of aliphatic conjugated diolefins. Particularly preferably, as the block A there can be mentioned polystyrene and poly(α-methylstyrene) and as the block B there can be mentioned polybutadiene and polyisoprene.

As specific examples of (A—B)$_n$—A, there can be mentioned polystyrene-polybudadiene-polystyrene, polystyrene-polyisoprene-polystyrene, poly(α-methylstyrene)-polybutadiene-poly(α-methylstyrene), polystyrene-polybutadiene-polystyrene-polybutadiene-polystyrene, polystyrene-polybutadiene-polystyrene-polybutadiene-polystyrene-polybutadiene-polystyrene and its analogous block copolymers in which the frequency n of the recurring units (A—B) is up to 10.

As specific examples of (B—A)$_{n+1}$—B, there can be mentioned polybutadiene-polystyrene-polybutadiene-polystyrene-polybutadiene, polyisoprene-polystyrene-polyisoprene-polystyrene-polyisoprene and its analogous block copolymers in which the frequency n of the recurring units (B—A) is up to 10.

As specific examples of (A—B)$_{n+1}$, there can be mentioned polystyrene-polybutadiene-polystyrene-polybutadiene, polystyrene-polyisoprene-polystyrene-polyisoprene, poly(α-methylstyrene)-polybutadiene-poly(α-methylstyrene)-polybutadiene, polystyrene-polybutadiene-polystyrene-polybutadiene-polystyrene-polybutadiene and its analogous block copolymers in which the frequency n of the recurring units (A—B) is up to 10.

As specific examples of (A—B)$_m$X, there can be mentioned (polystyrene-polybutadiene)$_4$Si, (polystyrene-polyisoprene)$_4$Si and (polystyrene-polybutadiene)$_2$Sn.

The thermoplastic elastomeric block copolymers as mentioned above are disclosed, for example, in British Pat. No. 1,366,769.

As examples of the thermoplastic elastomeric block copolymers that may be used in the present invention, there can also be mentioned those disclosed in U.S. Pat. No. 3,265,765 and British Pat. No. 1,366,769. These block copolymers may be used alone or in combination.

Of these block copolymers, from the viewpoints of the rubber elasticity and availability, block copolymers in which n is 1 are preferred. For example, there may preferably be employed polystyrene-polyisoprene-polystyrene, polystyrene-polybutadiene-polystyrene, polystyrene-polybutadiene-polystyrene-polybutadiene and (polystyrene-polybutadiene)$_4$Si.

The above-mentioned thermoplastic elastomeric block copolymers have rubber elasticity even in the uncured state due to physical crosslinking of the thermoplastic non-elastomeric polymer blocks interposing the elastomeric polymer block, and, hence, cold flow does not occur. But if the molecular weight of the thermoplastic non-elastomeric polymer block is too small, the physical crosslinking of the block copolymer becomes insufficient. On the other hand, if the molecular weight of said block is too large, the rubber elasticity of the block copolymer becomes insufficient. With respect to the elastomeric polymer block, if the molecular weight thereof is too small, said polymer block cannot impart a sufficient rubber elasticity to the block copolymer, while if the molecular weight is too large, there is caused degradation of the physical crosslinking of the block copolymer. In view of the foregoing, it is preferred that the number average molecular weight of the thermoplastic non-elastomeric polymer block be 2,000 to 100,000 and the number average molecular weight of the elastomeric polymer block be 25,000 to 1,000,000.

The thermoplastic elastomeric block copolymer that may be used in the present invention can be easily prepared, for example, according to the method as described in U.S. Pat. No. 3,265,765. Taking as an example the case of the preparation of (polystyrene-polyisoprene)$_n$-polystyrene, explanation will be made. sec-Butyl lithium is added to a benzene solution of styrene so that living polymerization is effected to obtain a first reaction mixture containing polystyrene anion radicals. Isoprene is then added to the first reaction mixture to effect polymerization, thereby to obtain a second reaction mixture containing polystyrene-polyisoprene anion radicals. Styrene is again added to the second reaction mixture to effect polymerization, thereby to obtain a third reaction mixture containing polystyrene-polyisoprene-polystyrene anion radicals. Further, isoprene and styrene are added one after the other to the third reaction mixture to effect polymerization, thereby to obtain the desired (polystyrene-polyisoprene)$_n$-polystyrene anion radicals wherein n may be a desired integer. Anion radicals as active species in the living polymerization are inactivated by adding such a compound having a hydroxyl group as water, an alcohol or phenol at the end of the polymerization. (B—A)$_{n+1}$—B and (A—B)$_{n+1}$ can be easily obtained according to the similar method as described above in which monomers corresponding to A and B are added one after the other to effect polymerization and the polymerization is stopped just after the intended block copolymer has been prepared. In the case of the preparation of (A—B)$_m$X, A—B anion radicals are prepared in the manner as described above, followed by addition of, for example, SiCl$_4$ or SnCl$_2$ as an inactivating agent, to obtain the intended block copolymer.

The thermoplastic elastomer that is employed as the component (a) of the photosensitive elastomeric composition of this invention has a rubber elasticity in the uncured state, and does not show any flowability at room temperature and hence cold flow is not caused but they are rendered flowable by heating. A sheet comprising a photosensitive elastomeric composition layer for a flexographic printing plate is ordinarily stored for a relatively long period between the sheet-preparing step and the printing plate-preparing step. Therefore, if cold flow is caused during the storage, the thickness of the sheet becomes uneven and the sheet cannot be practically used for the production of a printing plate. Accordingly, it is preferred that the component (a) should not show any flowability at room temperature and it is also preferred that the mixing ratio of the component (a) in the photosensitive elastomeric composition should be such that a property that cold flow does not occur is maintained in the photosensitive elastomeric composition. From this viewpoint, it is preferred that the component (a) be incorporated in an amount of at least 30% by weight based on the photosensitive elastomeric composition and it is possible to incorporate the component (a) in an amount of at most 98% by weight based on the photosensitive elastomeric composition. The amount of the component (a) may be varied depending on the intended physical properties of a printing plate, but from the viewpoints of the rubber elasticity and moldability, it is more preferred that the component (a) be incorporated in an amount of 55 to 95% by weight based on the photosensitive elastomeric composition.

The thermoplastic elastomeric block copolymers are preferred to the crystalline 1,2-polybutadiene and the acrylonitrile-butadiene copolymer from the viewpoints of the rubber elasticity and other properties of a printing plate prepared therefrom. However, in the special fields where a flexographic printing ink including a mixed solvent containing, for example, 30% by weight or more of a hydrocarbon solvent or a letterpress printing ink is used, the use of the acrylonitrile-butadiene copolymer is suitable.

The photosensitive elastomeric composition of the present invention comprises an N-substituted maleimide compound for improving the photosensitivity of the composition. N-Substituted maleimide compounds have such properties that they are dimerized by themselves upon irradiation with light and they are addition-reacted with benzene in a benzene solution thereof upon irradiation with light. In view of this, there has been proposed in U.S. Pat. No. 3,622,321 a photosensitive composition which is used as a photoresist and which comprises a polymer having benzene rings (e.g., an 85:15 styrene-butadiene copolymer) and a bis-maleimide compound. In this photosensitive composition, the bis-maleimide compound is used as a crosslinking agent and the addition reaction between the maleimide and the benzene ring is utilized but not a radical polymerization reaction. Where a mono-maleimide compound is used in place of the bis-maleimide compound, the insolubilization of the composition does not occur by irradiation with light because the polymer cannot be crosslinked even if the addition reaction occurs. In other words, in the proposed photosensitive composition, the use of the bis-maleimide compound is indispensable. On the other hand, a radical polymerization reaction is utilized in the photosensitive elastomeric composition of the present invention. If the use of the ethylenically unsaturated compound as the component (b) is omitted from the photosensitive elastomeric composition of the present invention, the resulting composition is not practically useful because it is too poor in photosensitivity even though it can be insolubilized upon irradiation with light. The photosensitive elastomeric composition of the present invention is excellent in photosensitivity as compared with those compositions containing an ethylenically unsaturated compound but no N-substituted maleimide compound and those compositions containing an N-substituted maleimide compound but no ethylenically unsaturated compound. In this sense, the N-substituted maleimide compound to be used as the component (d) functions as a photosensitizer in the photosensitive elastomeric composition of the present invention. This will also be apparent from the fact that N-substituted mono-maleimides do not fail to perform excellently in the photosensitive elastomeric composition of the present invention as compared with N,N'-substituted bis-maleimides.

There has also been proposed in Japanese Patent Application Laid-Open Specification No. 12859/1973 a photosensitive polyamide composition which is useful for the production of a printing plate with good resolution and which comprises a soluble polyamide, an N-substituted maleimide compound, an ethylenically unsaturated compound and a photopolymerization initiator. However, in this photosensitive polyamide composition, the N-substituted maleimide compound does not function as a photosensitizer as is apparent from Comparative Example 8. It is to be noted that an improvement in photosensitivity can be achieved only in a combination of a thermoplastic elastomer having conjugated diene monomer units such as butadiene or isoprene monomer units, an ethylenically unsaturated compound, a photopolymerization initiator and an N-substituted maleimide compound which combination constitutes the photosensitive elastomeric composition of the present invention.

The N-substituted maleimide compound that is incorporated into the photosensitive elastomeric composition of the present invention to improve the photosensitivity of the photosensitive elastomeric composition is selected from those maleimides wherein an N- or N,N'-substituent is a straight chain or branched alkyl group having 1 to 22 carbon atoms, a cycloalkyl group having a $C_5$–$C_8$ ring unsubstituted or substituted with 1 or 2 substituents selected from straight chain or branched alkyl groups having 1 to 6 carbon atoms, a phenyl or naphthyl group unsubstituted or substituted with 1 or 2 substituents selected from straight chain or branched alkyl groups having 1 to 6 carbon atoms and halogen atoms, an aralkyl group having a straight chain or branched $C_1$–$C_6$ alkyl moiety and a phenyl moiety unsubstituted or substituted with 1 or 2 substituents selected from straight chain or branched alkyl groups having 1 to 6 carbon atoms and halogen atoms, a straight chain or branched alkylene group having 1 to 12 carbon atoms, a phenylene group, a biphenylene group, a 1,6-hexamethylenebiphenylene group, a methylenebiphenylene group or a 2,2-diphenylenepropane group. Specific examples of the N-substituted maleimide compounds include N-methylmaleimide, N-ethylmaleimide, N-propylmaleimides, N-butylmaleimides, N-pentylmaleimides, N-n-hexylmaleimide, N-cyclohexylmaleimide, N-n-octylmaleimide, N-2-ethylhexylmaleimide, N-n-decylmaleimide, N-laurylmaleimide, N-stearylmaleimide, N-behenylmaleimide, N-phenylmaleimide, N-chlorophenylmaleimides, N-tolylmaleimides, N-xylylmaleimides, N-benzylmaleimide, N-(6-phenylhexyl)maleimide, N,N'-methylene-bis-maleimide, N,N'-ethylene-bis-maleimide, N,N'-trimethylene-bis-maleimide, N,N'-hexamethylene-bis-maleimide, N,N'-decamethylene-bis-maleimide, N,N'-dodecamethylene-bis-maleimide, N,N'-phenylene-bis-maleimide, N,N'-2,2-diphenylenepropane-bis-maleimide and N,N'-diphenylenemethane-bis-maleimide. They may be used either alone or in combination. The N-substituted maleimide compounds employable in the photosensitive elastomeric composition of the present invention are not restricted to those listed above.

Of these N-substituted maleimide compounds, mono-maleimide compounds are preferred to bis-maleimide compounds from the viewpoint of compatibility with the thermoplastic elastomer to be used as the component (a), and N-alkylmaleimides, N-cycloalkylmaleimides, N-phenylmaleimide and N-benzylmaleimide are more prepared from the viewpoints of availability and cost. Bis-maleimide compounds are employable but tend to be poor in compatibility with the thermoplastic elastomer, sometimes leading to the formation of a turbid photosensitive elastomeric composition and/or to the separation of the bis-maleimide compound from the photosensitive elastomeric composition during storage thereof (causing hazing on blooming). N-Alkylmaleimides having an alkyl group of a small carbon number tend to have an irritating odor and, hence, to be poor in workability. In this sense, N-alkylmaleimides having a $C_6$–$C_{22}$ alkyl group and N-cycloalkylmaleimides having a $C_6$–$C_{18}$ cycloalkyl group with a $C_6$ ring unsubstituted or substituted are especially preferred. N-alkylmaleimides having an alkyl group of 23 or more carbon atoms are poor in availability. N-unsubstituted maleimide is unable to be practically used because it has a strong irritating odor and is poor in compatibility with other components of the photosensitive elastomeric composition. N-Substituted maleimide compounds having an aryl group, such as N-phenylmaleimide, have a relatively high ultraviolet rays absorptivity, and, hence, the use of such an N-substituted maleimide compound is disadvantageous for the production of a printing plate having a thickness of 3 mm or more as compared with the use of an N-alkylmaleimide. This is so because the amount of actinic radiation (ultraviolet rays) reaching the central portion of the plate of the photosensitive elastomeric composition is decreased by the absorption of ultraviolet rays by the N-substituted maleimide compound itself.

The amount of an N-substituted maleimide compound to be used as the component (d) of the photosensitive elastomeric composition of the present invention may be in the range of from 0.01 to 10% by weight, preferably in the range of from 0.1 to 4% by weight, based on the photosensitive elastomeric composition. If the amount of the N-substituted maleimide compound is too small, a satisfactory improvement in photosensitivity cannot be obtained. If the amount of the N-substituted maleimide compound is too large, such a substantial improvement in photosensitivity as corresponds to the increased amount of the N-substituted maleimide compound cannot be obtained, only leading to economical disadvantageousness. Further, the use of too large an amount of the N-substituted maleimide compound is disadvantageous for the production of a thick printing plate because of the absorption of ultraviolet rays by the N-substituted maleimide compound itself.

N-Substituted maleimide compounds employable in the present invention may be easily prepared from maleic anhydride and the corresponding primary amines, for example, according to the method as described in Organic Syntheses, vol. 41, p. 93.

As the ethylenically unsaturated compound to be used as the component (b) of the photosensitive elastomeric composition of the present invention, there can be mentioned esters of acrylic acid, methacrylic acid, fumaric acid and maleic acid; derivatives of acrylamide and methacrylamide; allyl esters and triallyl cyanurate; styrene and derivatives thereof; and the like. The "ethylenically unsaturated compound" as defined herein does not include N-substituted maleimide compounds to be used as the component (d) in the present invention. Specific examples of the ethylenically unsaturated compounds include ethylene glycol diacrylate, ethylene glycol dimethacrylate, diethylene glycol diacrylate, diethylene glycol dimethacrylate, propylene glycol diacrylate, propylene glycol dimethacrylate, dipropylene glycol diacrylate, dipropylene glycol dimethacrylate, butylene glycol diacrylate, butylene glycol dimethacrylate, polyethylene glycol diacrylate (number average molecular weight: up to 1,500), polyethylene glycol dimethacrylate (number average molecular weight: up to 1,500), polypropylene glycol diacrylate (number average molecular weight: up to 1,500), polypropylene glycol dimethacrylate (number average molecular weight: up to 1,500), trimethylolpropane triacrylate, trimethylolpropane trimethacrylate, pentaerythritol tetraacrylate, pentaerythritol tetramethacrylate, N,N'-hexamethylene-bis-acrylamide, N,N'-hexamethylene-bis-methacrylamide, diacetone acrylamide, diacetone methacrylamide, styrene, vinyltoluene, divinylbenzene, diallyl phthalate, triallyl cyanurate, diethyl fumarate, dibutyl fumarates, dioctyl fumarates, didecyl fumarates, dilauryl fumarate, distearyl fumarate, butyl octyl fumarates, lauryl stearyl fumarate, dibehenyl fumarate, diphenyl fumarate, ditolyl fumarates, bis(ethylphenyl) fumarates, bis(dimethylphenyl) fumarates, bis(hexylphenyl) fumarates, dinaphthyl fumarates, bis(methylnaphthyl) fumarates, dibenzyl fumarate, bis(3-phenylpropyl) fumarate, bis(6-phenylhexyl) fumarate, bis(2-phenylethyl) fumarate, dibutyl maleates, dioctyl maleates, didecyl maleates, diphenyl maleate, ditolyl maleates, dilauryl maleate, distearyl maleate, dibenzyl maleate and bis(6-phenylhexyl) maleate. They may be used either alone or in combination. The ethylenically unsaturated compounds employable in the photosensitive elastomeric composition of the present invention are not restricted to those listed above.

Of these ethylenically unsaturated compounds, the fumarates and maleates are superior to the derivatives of acrylic acid and methacrylic acid from the viewpoint of stability of a photosensitive elastomeric composition at the step of heat molding thereof and during storage of an unexposed photosensitive elastomeric composition sheet. The fumarates are superior to the maleates from the viewpoint of reactivity, and, hence, the use of the fumarates is most preferred.

The ethylenically unsaturated compound is incorporated into the photosensitive elastomeric composition of the present invention for the purposes of imparting a reactivity to the photosensitive elastomeric composition and of improving the physical properties of the elastomeric composition after the curing thereof. Without the incorporation of the ethylenically unsaturated compound into the photosensitive elastomeric composition, the use of an N-substituted maleimide compound can impart reactivity to the photosensitive elastomeric composition to some extent but is not practical from the viewpoints of photosensitivity of the photosensitive elastomeric composition and physical properties, such as tensile strength, of the elastomeric composition after the curing thereof.

The amount of the ethylenically unsaturated compound to be used in the photosensitive elastomeric composition of the present invention may be varied depending upon the kind thereof, the intended properties of the printing plate to be produced and the like, but may usually be in the range of from 1 to 50% by weight, preferably in the range of from 4 to 30% by weight, based on the photosensitive elastomeric composition. If the amount of the ethylenically unsaturated compound is too small, the resulting composition may not be sufficiently cured by exposure to actinic radiation and no sufficient solvent insolubility is attained. Therefore, a part of an area to be formed as a relief is washed away at the solvent washing-out step which is conducted after the imagewise exposure to actinic radiation, and, hence, a satisfactory printing plate cannot be obtained. On the other hand, if the amount of the ethylenically unsaturated compound is too large, the resulting printing plate may be hard or brittle and poor in rubber elasticity, and in some case, the printing plate cannot be used for flexographic printing.

As the photopolymerization initiator effective for the photosensitive elastomeric composition of the present invention, there can be mentioned, for example, benzophenone, Michler's ketone, benzoin, benzoin methyl ether, benzoin ethyl ether, benzoin isopropyl ether, benzoin isobutyl ether, α-methylolbenzoin, α-methylolbenzoin methyl ether, α-methoxybenzoin ethyl ether, benzoin phenyl ether, α-tert-butyl-benzoin, 2,2-dimethoxy-2-phenylacetophenone, 2,2-diethoxy-2-phenylacetophenone, 2,2-diethoxyacetophenone, benzil, pivaloin, anthraquinone, benzanthraquinones, 2-ethylanthraquinone and 2-chloroanthraquinone. They may be used either alone or in combination. Of these photopolymerization initiators, benzoin or derivatives thereof are preferred from the viewpoint of photosensitivity. The photopolymerization initiator may be added in an effective amount for polymerization, i.e., 0.01 to 10% by weight, preferably 0.1 to 3% by weight, based on the photosensitive elastomeric composition.

The photosensitive elastomeric composition of this invention may further comprise 0.001 to 2% by weight, based on the photosensitive elastomeric composition, of a heat polymerization inhibitor. As such heat polymerization inhibitors, there can be mentioned, for example, 2,6-di-tert-butyl-p-cresol, p-methoxyphenol, pentaerythritol tetrakis[3-(3′,5′-di-tert-butyl-4′-hydroxy)-phenylpropionate], hydroquinone, tert-butylcatechol, tert-butylhydroxyanisole and 4,4′-butylidenebis(3-methyl-6-tert-butyl)phenol.

If desired, the photosensitive elastomeric composition of the present invention may comprise a plasticizer. In some cases, the plasticizer promotes removal of a light-unexposed area of the photosensitive elastomeric composition layer, renders physical properties such as hardness of the cured area desirable and facilitates kneading of the raw materials and formation or molding of the photosensitive elastomeric composition layer. The amount of the plasticizer may be varied according to the intended properties of the photosensitive elastomeric composition layer, but the plasticizer may usually be used in an amount of 50% by weight or less, preferably 40% by weight or less, based on the photosensitive elastomeric composition. As such plasticizers, there can be mentioned, for example, hydrocarbon oils such as naphthenic and paraffinic oils, low-molecular-weight polystyrene (having a number average molecular weight of 3,000 or less), α-methylstyrene-vinyltoluene copolymers, petroleum resins, pentaerythritol ester of hydrogenated resin, polyterpene resins, polyester resins, polyethylene, poly(α-methylstyrene), polyacrylates, liquid 1,2-polybutadiene, liquid 1,4-polybutadiene, liquid acrylonitrile-butadiene copolymers, liquid styrene-butadiene copolymers, vinyl chloride-vinyl acetate copolymers, stearic acid, polypentadienes, polyurethanes and ethylene-propylene-diene rubbers.

The case where the photosensitive elastomeric composition of the present invention is used for production of a flexographic printing plate will now be explained by way of example. A layer of the photosensitive elastomeric composition usually has a thickness of 0.5 to 7.0 mm. The layer is held at one side of the surface thereof on a support, and a cover sheet may be provided on the other side of the surface of the photosensitive composition layer remote from the support. This cover sheet may be provided for preventing the surface of the photosensitive elastomeric composition layer from being damaged and/or stained during storage and manipulation. If desired, an adhesive layer may be interposed between the support and the photosensitive elastomeric composition layer, and a thin polymer film layer or a thin, solvent-soluble, flexible polymer layer may be interposed between the cover sheet and the photosensitive elastomeric composition layer.

As the support, there can be mentioned, for example, plates, sheets and foils of metals such as iron, steels and aluminum, and films and plates of synthetic resins such as polystyrene, polyester, polypropylene and polyamide resins. The thickness of the support is usually within the range of from 50μ to 3 mm, but may be more than 3 mm in a special case.

As the cover sheet, there can be mentioned, for example, films of transparent synthetic resins such as polystyrene, polyethylene, polypropylene and polyester resins. The thickness of the cover sheet may be within the range of from 50μ to 1 mm.

As the adhesive material of the adhesive layer, there may be employed, for example, those described in U.S. Pat. No. 2,760,863 and U.S. Pat. No. 3,036,913. The thickness of the adhesive layer may be within the range of from 0.5 to 100μ.

The photosensitive elastomeric composition of the present invention is sometimes sticky according to the recipe thereof. In order to attain good contact, without the generation of bubble, between the photosensitive elastomeric composition layer and an image-bearing transparency to be superposed thereon, and in order to enable the reuse of the image-bearing transparency while preventing the image-bearing transparency from being damaged by the stickiness of the photosensitive elastomeric composition when the transparency is separated, a laminated layer of a thin film of polyethylene, polypropylene, polyester or polystyrene may be provided on the surface of the photosensitive elastomeric composition layer. The thickness of the laminated layer may be within the range of from 5 to 40μ. Such a film is stripped off after light exposure through the image-bearing transparency disposed on the film has been completed. For the same purpose, a thin, solvent-soluble, flexible polymer layer may be provided on the photosensitive elastomeric composition layer. This layer is removed simultaneously by dissolution when the light-unexposed area is dissolved away by a solvent after light exposure through the image-bearing transparency has been completed.

The photosensitive elastomeric composition plate or sheet of the present invention may be prepared according to various methods. For example, the raw materials of the photosensitive elastomeric composition are dissolved and mixed in an appropriate solvent such as chloroform, carbon tetrachloride, 1,1,1-trichloroethane, tetrachloroethylene, trichloroethylene, methyl ethyl ketone, methyl isobutyl ketone, toluene or tetrahydrofuran, and the resulting solution is cast in a mold and the solvent is then evaporated. Thus, a plate can be simply formed and used as such. When the plate so formed is heated and pressed, a plate having a high precision can be obtained. Alternatively, the raw materials of the photosensitive elastomeric composition are mixed using a kneader or a roll mill without the use of a solvent, and the resulting mixture is subjected to extrusion, injection, pressing or calendering to form a sheet having a desired thickness.

Lamination of the support and any cover sheet onto the so prepared photosensitive elastomeric composition plate or sheet may be done by roll laminating. If heat pressing is carried out after roll laminating, a photosensitive layer having a further improved precision can be obtained.

In order to provide a thin flexible polymer layer, for example, a layer of crystalline 1,2-polybutadiene, soluble polyamide, partially saponified polyvinyl acetate or a cellulose derivative such as cellulose acetate butyrate, on the surface of the photosensitive layer, a solution of such a polymer in an appropriate solvent is coated on the surface of the photosensitive layer. Alternatively, the polymer solution is first coated on a polyester film, a polypropylene film or the like and the coated polymer film is laminated onto the photosensitive layer to transfer the coated polymer film to the photosensitive layer. The thickness of such a flexible polymer layer may be within the range of from 0.05 to 30μ.

As the actinic radiation source that may be used to render the photosensitive elastomeric composition of the present invention solvent-insoluble, there can be mentioned, for example, a low pressure mercury lamp, a high pressure mercury lamp, an ultraviolet fluorescent lamp, a carbon arc lamp, a xenon lamp, a zirconium lamp and sun light.

An image is formed at the photosensitive elastomeric composition of the present invention by actinic radiation through an image-bearing transparency, and then, the unexposed area is dissolved away by a solvent. In this respect, it is necessary that this solvent dissolve the unexposed area but have hardly any influence on the exposed image area. As such a solvent, there can be mentioned, for example, 1,1,1-trichloroethane, tetrachloroethylene, trichloroethylene, tetrachloroethane, toluene and mixtures of such a solvent and 60% or less by weight of an alcohol such as ethanol, isopropanol or n-butanol. The unexposed area may be dissolved away by spraying such a solvent from a nozzle or brushing with a brush impregnated with such a solvent.

The photosensitive elastomeric composition of the present invention has high photosensitivity and excellent properties as a material for the production of a flexographic printing plate. Besides, the composition of the present invention can be used for the production of a photoresist or a screen for screen printing.

The following Examples illustrate the present invention in more detail, but should not be construed as limiting the scope of the invention.

EXAMPLE 1 AND COMPARATIVE EXAMPLE 1

1 Mole of maleic anhydride and 300 g of dimethylformamide were charged into a 2-liter three-necked flask and stirred to dissolve the maleic anhydride into the dimethylformamide. To the resulting solution were added, with stirring, 1.02 moles of laurylamine over a period of 30 minutes while cooling the flask in a cold water bath. The exothermic reaction occurred simultaneously with the addition of the laurylamine which was, therefore, so carefully done that the temperature of the reaction mixture could be maintained at around 50° C. Immediately after completion of the addition of the laurylamine, the bath temperature was increased to 50° C. at which the stirring was continued for 1 hour. After completion of the amide-formation reaction, 1.6 moles of acetic anhydride, 0.016 mole of nickel acetate and 0.16 mole of triethylamine were added, with stirring, to the reaction mixture. The resulting mixture was heated to 90°–95° C. at which the stirring was continued for 1.5 hours to effect the dehydration reaction. Subsequently, the reaction mixture was cooled to room temperature and poured into ice and water to yield a precipitate. The precipitate was collected by filtration, washed with water, neutralized with sodium carbonate and recrystallized twice from water-containing ethanol (90%) to obtain white crystals of N-laurylmaleimide having a melting point of 56° C.

4 Kg of a polystyrene-polyisoprene-polystyrene block copolymer prepared according to the method as described in U.S. Pat. No. 3,265,765 (styrene content: 14% by weight, number average molecular weight measured according to the GPC method: 225,000), 1 Kg of di-n-octyl fumarate, 700 g of "Nisso PB B-2000" (tradename of a liquid 1,2-polybutadiene manufactured and sold by Nippon Soda Co., Ltd., Japan), 100 g of benzoin isopropyl ether and 10 g of 2,6-di-tert-butyl-p-cresol were kneaded using a kneader to obtain a kneaded composition. 1 Kg of the kneaded composition and 20 g of N-laurylmaleimide were kneaded using a roll mill to obtain another kneaded composition.

Each of the composition containing N-laurylmaleimide and the composition containing no N-laurylmaleimide was placed inside a 2 mm-thick spacer on one piece of a 100μ thick polyester film and interposed between said piece of the polyester film and another piece of the 100μ thick polyester film, and pressed at 110° C. by a platen press to obtain a photosensitive elastomeric composition sheet.

With respect to each photosensitive elastomeric composition sheet, the photosensitivity of the photosensitive elastomeric composition were examined as follows. Each sheet was cut to a size of 5 cm×15 cm. The cut sheet was covered all over the surface thereof with five black rubber plates each having a size of 6 cm×3 cm, over which an ultraviolet fluorescent lamp was so located that the intensity of actinic radiation from the ultraviolet fluorescent lamp was 0.70 mW/cm$^2$ at the surface of the photosensitive elastomeric composition sheet. The first black rubber plate was taken off from the surface of the composition sheet and the other black rubber plates were successively taken off at an interval of 1 minute. One minute after the last black rubber plate was taken off, the composition sheet was taken away outside the reach of the actinic radiation. The polyester film on the side of incidence of the actinic radiation was peeled off, and the remaining composition sheet was subjected to washing-out using a brush by a mixed solvent of 1,1,1-trichloroethane/isopropanol (2/1 by volume), followed by drying at 60° C. for 30 minutes and cooling to room temperature. The exposure time required for the curing of the composition was determined by observing the sheet so obtained.

The results were as shown in Table 1.

TABLE 1

| Run No. | N-Laurylmaleimide | Exposure time required for the curing (minute) |
|---|---|---|
| 1 | contained | 2 |
| 2 | not contained | 4 |

EXAMPLE 2 AND COMPARATIVE EXAMPLE 2

4.6 Kg of a polystyrene-polybutadiene-polystyrene block copolymer prepared according to the method as described in U.S. Pat. No. 3,265,765 (styrene content: 30% by weight, number average molecular weight measured according to the GPC method: 220,000), 1.3 Kg of "Nisso PB B-3000" (tradename of a liquid 1,2-polybutadiene manufactured and sold by Nippon Soda Co., Ltd., Japan), 1.3 Kg of "Polyoil 130" (tradename of a liquid 1,4-polybutadiene manufactured and sold by Nippon Zeon Co., Ltd., Japan), 650 g of dilauryl fumarate, 156 g of benzoin isopropyl ether and 16 g of 2,6-di-tert-butyl-p-cresol were kneaded using a kneader to obtain a kneaded composition.

500 g each of the kneaded composition was kneaded, using a roll mill, together with each of maleimide compounds listed in Table 2, whose amounts are also listed in Table 2 and which had been respectively prepared using the corresponding amines in substantially the same manner as described in Example 1 and Comparative Example 1.

The composition containing no maleimide compound as well as each of the compositions containing the indicated maleimide compounds was placed inside a 2 mm-thick spacer on one piece of a 100μ-thick polyester film and interposed between said piece of the polyester film and another piece of the 100μ-thick polyester film, and pressed at 110° C. by a platen press to obtain a photosensitive elastomeric composition sheet.

With respect to each photosensitive elastomeric composition sheet, the exposure time required for the curing of the composition (photosensitivity of the photosensitive elastomeric composition) was examined in the same manner as described in Example 1 and Comparative Example 1. The results were as shown in Table 2.

TABLE 2

| Run No. | Maleimide Compound | Exposure time required for the curing (minute) |
|---|---|---|
| 3 | not contained | 4 |
| 4 | N-Cyclohexylmaleimide (2.5 g) | 3 |
| 5 | N-Phenylmaleimide (2.5 g) | 2 |
| 6 | N-Ethylmaleimide (2.5 g) | 2 |
| 7 | N-Stearylmaleimide (2.5 g) | 3 |
| 8 | N,N'-2,2-Diphenylenepropane-p,p'-bis-maleimide (2.5 g) | 2 |
| 9 | N-Benzylmaleimide (2.5 g) | 3 |
| 10 | N-p-Chlorophenylmaleimide (2.5 g) | 2 |
| 11 | N-Cyclohexylmaleimide (7.0 g) | 2 |
| 12 | N-Phenylmaleimide (0.5 g) | 3 |
| 13 | N,N'-Hexamethylene-bis-maleimide (2.5 g) | 3 |
| 14 | N-Laurylmaleimide (40 g) | 1 |
| 15 | N-Phenylmaleimide (0.2 g) | 3 |

EXAMPLE 3 AND COMPARATIVE EXAMPLE 3

Kneaded compositions were prepared using a kneader in substantially the same manner as described in Example 2 and Comparative Example 2 except that ethylenically unsaturated compounds as indicated in Table 3 were used in place of dilauryl fumarate in Runs Nos. 16 to 20 and 22 to 25 and no ethylenically unsaturated compound was used in Run No. 21.

Kneaded compositions each containing a maleimide compound as indicated in Table 3 were prepared using a roll mill.

Photosensitive elastomeric composition sheets each comprising a composition as shown in Table 3 were prepared in substantially the same manner as described in Example 1 and Comparative Example 1.

With respect to each photosensitive elastomeric composition sheet, the exposure time required for the curing of the composition (photosensitivity of the photosensitive elastomeric composition) was examined in the same manner as described in Example 1 and Comparative Example 1. The results were as shown in Table 3.

TABLE 3

| Run No. | Ethylenically unsaturated compound (% by weight*) | Maleimide compound (% by weight*) | Exposure time required for the curing (minute) |
|---|---|---|---|
| 16 | Diethylene glycol dimethacrylate (10) | not contained | 4 |
| 17 | Diethylene glycol dimethacrylate (10) | N-Phenylmaleimide (0.5) | 2 |

TABLE 3-continued

| Run No. | Ethylenically unsaturated compound (% by weight*) | Maleimide compound (% by weight*) | Exposure time required for the curing (minute) |
|---|---|---|---|
| 18 | Diethylene glycol dimethacrylate (10) | N-Laurylmaleimide (2.0) | 2 |
| 19 | Trimethylolpropane triacrylate (5) | not contained | 4 |
| 20 | Trimethylolpropane triacrylate (5) | N-Cyclohexyl-maleimide (1.5) | 2 |
| 21 | not contained | N-Laurylmaleimide (2.0) | more than 5 minutes |
| 22 | Butylene glycol diacrylate (10) | not contained | 4 |
| 23 | Butylene glycol diacrylate (10) | N-o-Chlorophenyl-maleimide (1.0) | 2 |
| 24 | Diethylene glycol dimethacrylate (3) Diallyl phthalate (3) | not contained | 5 |
| 25 | Diethylene glycol dimethacrylate (3) Diallyl phthalate (3) | N-Stearylmaleimide (2.5) | 3 |

Note
*based on the photosensitive elastomeric composition

EXAMPLE 4 AND COMPARATIVE EXAMPLE 4

2 Kg of a crystalline 1,2-polybutadiene (crystallinity: 18%, number average molecular weight: 110,000, rate of 1,2-addition: 90% according to infrared spectrophotometric analysis) which had been prepared according to the method as described in Japanese Patent Publication No. 32425/1969, 1 Kg of "B 2000" (tradename of a liquid polybutadiene manufactured and sold by Nippon Petrochemicals Co., Ltd., Japan), 250 g di-n-octyl fumarate, 30 g of benzoin isobutyl ether and 1.5 g of p-methoxyphenol were kneaded using a kneader to obtain a kneaded composition. A part of the kneaded composition and N-stearylmaleimide whose amount was as shown in Table 4 were kneaded using a roll mill to obtain another kneaded composition.

Photosensitive elastomeric composition sheets each comprising a composition as shown in Table 4 were prepared in substantially the same manner as described in Example 1 and Comparative Example 1.

With respect to each photosensitive elastomeric composition sheet, the exposure time required for the curing of the composition (photosensitivity of the photosensitive elastomeric composition) was examined in the same manner as described in Example 1 and Comparative Example 1. The results were as shown in Table 4.

TABLE 4

| Run No. | N-Stearylmaleimide | Exposure time required for the curing (minute) |
|---|---|---|
| 26 | not contained | 4 |
| 27 | 3% by weight* | 2 |

Note
*based on the photosensitive elastomeric composition

EXAMPLE 5 AND COMPARATIVE EXAMPLE 5

2 Kg of an acrylonitrile-butadiene copolymer (acrylonitrile content: 33% by weight, number average molecular weight: 300,000) which had been prepared by emulsion polymerization using potassium persulfate as the polymerization catalyst and dodecylmercaptan as the chain transfer agent, 2 Kg of Zeon Resin "400×150 ML" [tradename of vinyl chloride-vinyl acetate copolymer (vinyl acetate content: 10% by weight) manufactured and sold by Nippon Zeon Co., Ltd., Japan], 400 g of di-n-butyl fumarate, 30 g of benzoin isobutyl ether and 1.5 g of p-methoxyphenol were kneaded using a kneader to obtain a kneaded composition. A part of the kneaded composition and N-laurylmaleimide whose amount way as shown in Table 5 were kneaded using a roll mill to obtain another kneaded composition.

Photosensitive elastomeric composition sheets each comprising a composition as shown in Table 5 were prepared in substantially the same manner as described in Example 1 and Comparative Example 1.

With respect to each photosensitive elastomeric composition sheet, the exposure time required for the curing of the composition (photosensitivity of the photosensitive elastomeric composition) was examined in the same manner as described in Example 1 and Comparative Example 1. The results were as shown in Table 5.

TABLE 5

| Run No. | N-Laurylmaleimide | Exposure time required for the curing (minute) |
|---|---|---|
| 28 | not contained | 4 |
| 29 | 3% by weight* | 3 |

Note
*based on the photosensitive elastomeric composition

EXAMPLE 6 AND COMPARATIVE EXAMPLE 6

1,750 g of a polyisoprene-polystyrene-polyisoprenepolystyrene-polyisoprene block copolymer prepared by living polymerization using sec-butyl lithium as the polymerization initiator (styrene content: 20% by weight, number average molecular weight: 300,000), 100 g of dibenzyl fumarate, 400 g of distearyl fumarate and 60 g of 2,2-diethoxy-2-phenylacetophenone were kneaded using a kneader.

Kneaded compositions each containing one or two maleimide compounds as indicated in Table 6 were prepared using a roll mill.

Photosensitive elastomeric composition sheets each comprising a composition as shown in Table 6 were prepared in substantially the same manner as described in Example 1 and Comparative Example 1.

With respect to each photosensitive elastomeric composition sheet, the exposure time required for the curing of the composition (photosensitivity of the photosensitive elastomeric composition) was examined in the same manner as described in Example 1 and Comparative Example 1. The results were as shown in Table 6.

TABLE 6

| Run No. | Maleimide compound (% by weight*) | Exposure time required for the curing (minute) |
|---|---|---|
| 30 | not contained | 4 |
| 31 | N-n-Octylmaleimide (2.0) | 2 |
| 32 | N-n-Decylmaleimide (7.0) | 1 |
| 33 | N-Phenylmaleimide (0.2) N-Laurylmaleimide (0.8) | 2 |

Note
*based on the photosensitive elastomeric composition

EXAMPLE 7 AND COMPARATIVE EXAMPLE 7

1,500 g of a (polystyrene-polybutadiene)4Si block copolymer prepared by inactivating with SiCl4 polystyrenepolybutadiene anion radicals obtained by living polymerization using sec-butyl lithium as the polymerization initiator (styrene content: 35% by weight, number average molecular weight: 200,000), 600 g of "B 2000", 200 g of tetraethylene glycol dimethacrylate, 50 g of di-n-octyl maleate, 100 g of di-n-octyl fumarate, 50 g of α-methylolbenzoin methyl ether, 2 g of pentaerythritol tetrakis [3-(3',5'-di-tert-butyl-4'-hydroxy)phenyl-propionate] were kneaded using a kneader.

Kneaded compositions each containing a maleimide compound as indicated in Table 7 were prepared using a roll mill.

Photosensitive elastomeric composition sheets each comprising a composition as shown in Table 7 were prepared in substantially the same manner as described in Example 1 and Comparative Example 1.

With respect to each photosensitive elastomeric composition sheet, the exposure time required for the curing of the composition (photosensitivity of the photosensitive elastomeric composition) was examined in the same manner as described in Example 1 and Comparative Example 1. The results were as shown in Table 7.

TABLE 7

| Run No. | Maleimide compound (% by weight*) | Exposure time required for the curing (minute) |
|---|---|---|
| 34 | not contained | 4 |
| 35 | N-2-ethylhexylmaleimide (3.0) | 2 |
| 36 | N,N'-Decamethylene-bis-maleimide (0.5) | 3 |

Note
*based on the photosensitive elastomeric composition

COMPARATIVE EXAMPLE 8

500 g of a soluble polyamide prepared by the polycondensation reaction of 2 moles of ε-caprolactam, 1 mole of hexamethylenediammonium adipate and 0.5 mole of butylenediammonium sebacate, 20 g of N,N'-methylene-bis-acrylamide, 50 g of acrylamide and 12 g of benzophenone were dissolved and mixed in ethanol. The resulting solution was divided into two halves, into one half of which 2 g of N-n-butylmaleimide were added and dissolved to obtain another solution.

Each solution was cast in a mold and allowed to stand at 30° C. for one week to evaporate the ethanol. The sheet thus obtained was put into a vacuum desiccator and dried under a pressure of 20 mmHg for 6 hours to remove the ethanol completely. The resulting sheet was placed inside a 2 mm-thick spacer on one piece of a 100 μ-thick polyester film and interposed between said piece of the polyester film and another piece of the 100 μ-thick polyester film, and pressed by a platen press to obtain a photosensitive composition sheet having a uniform thickness.

With respect to each photosensitive composition sheet, the exposure time required for the curing of the composition (photosensitivity of the photosensitive composition) was examined in the same manner as described in Example 1 and Comparative Example 1 except that ethanol was used as the washing-out liquid. The results were as shown in Table 8.

TABLE 8

| Run No. | N-n-Butylmaleimide | Exposure time required for the curing (minute) |
|---|---|---|
| 37 | not contained | 4 |
| 38 | contained | 4 |

EXAMPLE 8 AND COMPARATIVE EXAMPLE 9

3 Kg of a polystyrene-polybutadiene-polystyrenepolybutadiene block copolymer prepared by living polymerization using sec-butyl lithium as the polymerization initiator (styrene content: 40% by weight, number average molecular weight measured according to the GPC method: 200,000), 700 g of "Nisso PB B-3000", 800 g of "Polyoil 130", 500 g of di-n-octyl fumarate, 150 g of 2,2-dimethoxy-2-phenylacetophenone and 5 g of 2,6-di-tert-butyl-p-cresol were kneaded using a kneader to obtain a kneaded composition.

A solution of 8 g of cellulose acetate butyrate in 200 g of a mixed solvent of ethyl acetate/ethylene glycol monoethyl ether acetate (1/1 by volume) was coated by spin coating on a 100 μ-thick polyester film to give a polyester film having thereon a cellulose acetate butyrate layer having a dry thickness of 4μ.

1 Kg of the kneaded composition was placed inside a 3 mm-thick spacer on one piece of a 100 μ-thick polyester film and interposed between said piece of the polyester film and another piece of the 100 μ-thick polyester film, and pressed at 110° C. by a platen press to obtain a photosensitive elastomeric composition sheet. One of the two pieces of the polyester film was peeled off and the polyester film having thereon the cellulose acetate butyrate layer was laminated, using a rubber roll, onto the photosensitive elastomeric composition layer of the remaining composition sheet so that the cellulose acetate butyrate layer was in contact with the photosensitive elastomeric composition layer. The polyester film on the side of the cellulose acetate butyrate layer was peeled off to effect the transfer of the cellulose acetate butyrate layer to the surface of the photosensitive elastomeric composition layer. An image-bearing transparency was placed on the cellulose acetate butyrate layer, and a 80 μ-thick polyethylene film was placed thereover to cover the transparency. The inside under the polyethylene film was evacuated through a perforated plate provided under the polyester film having thereon the photosensitive elastomeric composition layer to remove air, whereby the image-bearing transparency was closely contacted with the cellulose acetate butyrate layer. The photosensitive elastomeric composition layer was exposed for 15 minutes through the image-bearing transparency and the cellulose acetate butyrate layer to actinic radiation having an intensity of 2.5 mW/cm$^2$ and emitted from an ultraviolet fluorescent lamp. The image-bearing transparency was taken off, and the remaining sheet was subjected to washing-out using a brush by a mixed solvent of 1,1,1-trichloroethane/isopropanol (2/1 by volume), dried at 60° C. for 30 minutes, cooled to room temperature and subjected to 10-minutes post-exposure to the same actinic radiation as mentioned above to obtain a printing plate on which there was not formed such a highlight portion as gave a 4% dot area in the unit area (1/100 inch$^2$) of a lattice comprising 100 lines/inch in each of length and breadth.

1 Kg of the kneaded composition and 20 g of N-laurylmaleimide was kneaded using a roll mill to obtain amother kneaded composition. Using this kneaded composition, a photosensitive elastomeric composition sheet was prepared in substantially the same manner as described above, and a printing plate was produced from the photosensitive elastomeric composition sheet in substantially the same manner as described above. A complete highlight portion giving such a 4% dot area as defined above was formed on the printing plate. Using this printing plate, flexographic printing was carried out to give good prints.

What is claimed is:

1. A photosensitive elastomeric composition consisting essentially of 30 to 98% by weight, based on the photosensitive elastomeric composition, of a component (a) comprising at least one thermoplastic elastomer having a number average molecular weight of 29,000 to 4,500,000 and selected from homopolymers of a conjugated diene monomer and copolymers of a conjugated diene monomer and a monoene monomer, 1 to 50% by weight, based on the photosensitive elastomeric composition, of a component (b) comprising at least one ethylenically unsaturated compound, 0.01 to 10% by weight, based on the photosensitive elastomeric composition, of a component (c) comprising at least one photopolymerization initiator, and 0.01 to 10% by weight, based on the photosensitive elastomeric composition, of a component (d) comprising at least one N-substituted maleimide compound selected from those maleimides wherein an N- or N,N'-substituent is a straight chain or branched alkyl group having 1 to 22 carbon atoms, a cycloalkyl group having a $C_5$–$C_8$ ring unsubstituted or substituted with 1 or 2 substituents selected from straight chain or branched alkyl groups having 1 to 6 carbon atoms, a phenyl or naphthyl group unsubstituted or substituted with 1 or 2 substituents selected from straight chain or branched alkyl groups having 1 to 6 carbon atoms and halogen atoms, an aralkyl group having a straight chain or branched $C_1$–$C_6$ alkyl moiety and a phenyl moiety unsubstituted or substituted with 1 or 2 substituents selected from straight chain or branched alkyl groups having 1 to 6 carbon atoms and halogen atoms, a straight chain or branched alkylene group having 1 to 12 carbon atoms, a phenylene group, a biphenylene group, a 1,6-hexamethylenebiphenylene group, a methylenebiphenylene group or a 2,2-diphenylenepropane group.

2. A photosensitive elastomeric composition as claimed in claim 1, wherein said component (a) is at least one thermoplastic elastomer selected from a crystalline 1,2-polybutadiene having a crystallinity of 10 to 30%, an acrylonitrile-butadiene copolymer containing 30 to 50% by weight of acrylonitrile monomer units and thermoplastic elastomeric block copolymers represented by the following general formulae:

$(A–B)_n–A$, $(B–A)_{n+1}–B$, $(A–B)_{n+1}$ and $(A–B)_mX$ wherein A stands for a thermoplastic non-elastomeric polymer block of a monoene monomer having a glass transition temperature of 25° C. or more, B stands for an elastomeric polymeric block of a conjugated diene monomer having a glass transition temperature of 10° C. or less, X stands for Sn or Si, n is an integer of from 1 to 10, and m is 2 or 4.

3. A photosensitive elastomeric composition as claimed in claim 2, wherein said component (a) is at least one thermoplastic elastomer selected from thermoplastic elastomeric block copolymers in which the thermoplastic nonelastomeric polymer block has a number average molecular weight of 2,000 to 100,000 and the elastomeric polymer block has a number average molecular weight of 25,000 to 1,000,000.

4. A photosensitive elastomeric composition as claimed in claim 2 or 3, wherein said component (a) is at least one thermoplastic elastomeric selected from thermoplastic elastomeric block copolymers represented by the following general formulae:

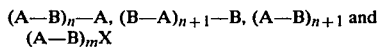
$A–B–A$, $A–B–A–B$ and $(A–B)_4Si$ wherein A stands for a polystyrene block and B stands for a polyisoprene block or a polybutadiene block.

5. A photosensitive elastomeric composition as claimed in claim 1, wherein said component (b) is at least one ethylenically unsaturated compound selected from diesters of fumaric acid.

6. A photosensitive elastomeric composition as claimed in claim 1, wherein said component (d) is at least one N-substituted maleimide compound selected from those maleimides wherein an N-substituent is a straight chain or branched alkyl group having 1 to 22 carbon atoms, a cycloalkyl group having a $C_5$–$C_8$ ring unsubstituted or substituted with 1 or 2 substituents selected from straight chain or branched alkyl groups having 1 to 6 carbon atoms, a phenyl or naphthyl group unsubstituted or substituted with 1 or 2 substituents selected from straight chain or branched alkyl groups having 1 to 6 carbon atoms and halogen atoms, or an aralkyl group having a straight chain or branched $C_1$–$C_6$ alkyl moiety and a phenyl moiety unsubstituted or substituted with 1 or 2 substituents selected from straight chain or branched alkyl groups having 1 to 6 carbon atoms and halogen atoms.

7. A photosensitive elastomeric composition as claimed in claim 6, wherein said component (d) is at least one N-substituted maleimide compound selected from those maleimides wherein an N-substituent is a straight chain or branched alkyl group having 1 to 22 carbon atoms, a cycloalkyl group having a $C_5$–$C_8$ ring unsubstituted or substituted with 1 or 2 substituents selected from straight chain or branched alkyl groups having 1 to 6 carbon atoms, a phenyl group, or a benzyl group.

8. A photosensitive elastomeric composition as claimed in claim 7, wherein said component (d) is at least one N-substituted maleimide compound selected from those maleimides wherein an N-substituent is a straight chain or branched alkyl group having 6 to 22 carbon atoms, or a cycloalkyl group having a $C_6$ ring unsubstituted or substituted with 1 or 2 substituents selected from straight chain or branched alkyl groups having 1 to 6 carbon atoms.

9. A photosensitive element comprising a support bearing a layer of a photosensitive elastomeric composition as claimed in any of claims 1 to 8.

10. A photosensitive element as claimed in claim 9, wherein said layer of the photosensitive elastomeric composition has thickness of 0.5 to 7.0 mm.

11. A photosensitive element as claimed in claim 9 or 10, wherein a flexible cover sheet is present on the side of the photosensitive elastomeric composition layer remote from the support.

12. A photosensitive element as claimed in claim 11, wherein a flexible polymer layer is interposed between the cover sheet and the surface of the photosensitive elastomeric composition layer.

13. A photosensitive elastomeric composition as claimed in claim 1, wherein said component (c) is at least one photopolymerization initiator selected from benzoin, benzoin methyl ether, benzoin ethyl ether, benzoin isopropyl ether, benzoin isobutyl ether, α-methylolbenzoin, α-methylolbenzoin methyl ether, α-methylolbenzoin ethyl ether, benzoin phenyl ether, α-tert-butylbenzoin, 2,2-dimethoxy-2-phenylacetophenone, 2,2-diethoxy-2-phenylacetophenone and 2,2-diethoxyacetophenone.

* * * * *